TRANSISTOR WITH LEAD-IN ELECTRODES

Filed Oct. 30, 1967

INVENTOR
BERNHARD DIETRICH

BY [signature]
ATTORNEY

United States Patent Office 3,518,504
Patented June 30, 1970

3,518,504
TRANSISTOR WITH LEAD-IN ELECTRODES

Bernhard Dietrich, Freiburg, Germany, assignor to International Standard Electric Corporation, New York, N.Y., a corporation of Delaware Filed Oct. 30, 1967, Ser. No. 679,059
Claims priority, application Germany, Nov. 15, 1966, D 51,549
Int. Cl. H01l 1/14
U.S. Cl. 317—234 6 Claims

ABSTRACT OF THE DISCLOSURE

This invention is for a semiconductive device which has a shielding zone therein and electrodes connected to the base emitter, collector and the shielding zone, at least one of the electrodes is disposed between the other electrodes.

BACKGROUND OF THE INVENTION

Figure 1:
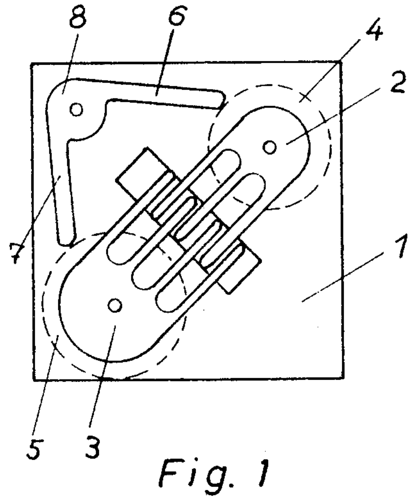

This invention relates to high frequency transistors wherein the lead-in electrodes are so arranged that at least one electrode is disposed as a shield between the other electrodes.

So-called planar transistors are known in which the various zones of the transistor are inserted into one another, and have a common surface. The various pn-junctions extend up to the common surface and are there covered with a layer or film of insulating material extending throughout the surface of the semi-conductor body, the film of insulating material generally being an oxide film consisting of the oxide of the semi-conductor material. The individual zones are often contacted by so-called conducting tracks extending on the protective layer of insulating material. The lead-in capacitance constituted between the conductive tracks or deposited leads and the zones of the semi-conductor body lying therebelow, restricts the use in the case of high frequencies.

The prior art shows various steps and measures for reducing this lead-in capacitance. These steps and measures substantially consist in that directly below the lead-in conductor deposited leads extending on the layer of insulating material, within the semi-conductor body, there is arranged a zone of a conductivity type which is opposite with respect to that of the surrounding semi-conductor material. The barrier layer capacitance of the pn-junction constituted by this zone, is in series with the lead-in capacitance, so that altogether there will result a reduced series capacitance. This additional zone may also be considered as a shielding between the coatings constituting the lead-in capacitance, and may be applied to a potential. Quite depending on the kind of circuit in which the transistor is used, such additional zones will be arranged either below the emitter lead-in conductors or below the base lead-in conductors, and will connect them each time with the base zone or the emitter zone respectively. This connection may likewise be established with the aid of conductive tracks or deposited leads on the surface layer of insulating material.

An object of this invention is to provide a transistor with improved internal shielding of the electrodes.

SUMMARY

The present invention provides a transistor for use at high frequency wherein a lead-in electrode is arranged in a shielding manner between at least two electrodes.

IN THE DRAWING

FIG. 1 shows a transistor made in accordance with the teaching of the prior art, and FIGS. 2–5 shows embodiments of a transistor made in accordance with the teaching of this invention.

DETAILED DESCRIPTION

In FIG. 1 a transistor made according to the prior art is shown schematically, and is featured by a particularly universal applicability. In a semi-conductor body 1, e.g. of an n-conducting silicon, there is produced one emitter and one base zone with the aid of conventional masking and diffusion methods. Below the emitter contact 2 and the base contact 3 there are diffused each time one zone of a conductivity type which is in opposition to that of the surrounding semi-conductor material. In the drawing they are indicated by the dash lines, as additional zones 4 and 5. With the aid of the conducting tracks or deposited leads 6 and 7, both are led to the contacting surface 8. In this way it may be chosen, depending on the intended practical application of a transistor in a circuit, to establish a connection between the contact 8 and the emitter contact 2, or between the contact 8 and the base contact 3.

The advantages as obtained by the steps and measures for reducing the lead-in capacitance in the case of transistors provided with conducting tracks or deposited leads, as described hereinbefore, are partly annulled by the unfavourable arrangement of the lead-in electrodes or socket or base pins necessary for effecting the connection. Reactive capacitances are again likely to be caused thereby. To a particularly strong extent, this phenomenon appears e.g. in connection with the manufacture of transistors which are surrounded by a plastics envelope, and which are not mounted on fixed sockets, but are contacted with the aid of metal strips or wires.

The present invention relates to a kind of transistors employing lead-in electrodes of the type described hereinbefore, which are designed for operating at high frequencies, and the invention is in particular concerned with planar transistors which are contacted with the aid of conducting tracks or deposited leads, and for the purpose of reducing the lead-in capacitance, are provided inside the semi-conductor body with a zone of a conductivity type which is in opposition to that of the surrounding semi-conductor material. The disadvantages of the conventional types of lead-in arrangements are avoided by the present invention in that one of the lead-in electrodes with its portion pointing towards the inside, is arranged in a shielding fashion between the inwardly pointing portions of the other lead-in electrodes. By this construction it is accomplished that the reduction of the capacitance as obtained by the particular type of construction of the transistor, is still assisted by the suitable position of the lead-in electrodes with respect to one another.

The further advantages and features of the invention will now be described in detail with reference to FIGS. 2 to 5 of the copending drawings schematically representing the various embodiments together with the features of the present invention.

The exemplified embodiments as shown in the copending drawings exclusively refer to so-called plastic encapsulated transistor devices, in which the semi-conductor bory is not mounted to a socket with a metal part and base pins led therethrough in an insulated fashion, but is mounted to metal tapes or wires, and is mechanically held together and protected by an envelope or encapsulation of plastics material with the metal tapes or wires serving as the lead-in electrodes. To this end it is possible to use, e.g. metal nets consisting of individual metal tapes or stripes joined to one another in a suitable way, to which the semi-conductor body is mounted, and is electrically connected with the aid of thin wires. Subsequently to the manufacture of the plastic encapsulation or envelope, the metal tapes or stripes are cut through in a suitable way. It is appropriate to design the tapes or stripes so narrow as to reduce the skin effect. Of course, the invention is in no way restricted to this kind of lead-in electrodes and encapsulation, but may in fact be analogously also applied to transistors provided with normal sockets or base portions.

Figure 2:
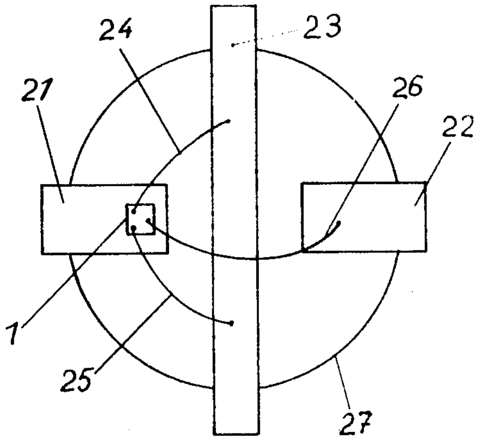

In FIG. 2, a transistor as shown in FIG. 1 is mounted with the semi-conductor body 1 to the lead-in electrode 21 representing the collector lead-in, with the aid of any conventional method. The base electrode on the transistor is connected to the base lead-in electrode 22 with the aid of a thin wire 26. Between these two lead-in electrodes there is arranged the lead-in electrode 23 which, in the present case, serves as the emitter lead-in, and is connected thereto with the aid of the thin wire 24. At the same time, in the present case, the contact 8 which is connected to the additional zones 4 and 5, is connected to the emitter with the aid of the wire 25. In this way the additional zone 5 which is arranged below the base lead stripe, is applied to emitter potential and serves as the shielding (shield zone) in a grounded emitter circuit. When employed in a grounded base circuit, the wire 25 would have to be connected to the base electrode for accomplishing in this way that the zone which is arranged below the emitter lead stripe, would be lying at base potential. Of course, it is also possible to design transistors in which the additional zone already at the component or device, is firmly connected to the base or emitter electrode, in the way as shown in FIG. 2. The plastic encapsulation is denoted by the circle 27.

The arrangement of the lead-in electrodes according to FIG. 2 still has the added advantage that the pole of the transistor which is common to both the input and the output circuit (emitter for grounded emitter circuit) comprises a lead-in electrode 23 with two connecting possibilities. In this way, it is possible to connect the input circuit to the one, and the output circuit to the other end. In this way there is extensively avoided a coupling of both circuits via a common lead-in inductance, resulting in an improvement of the power amplification.

Figures 3, 4, 5:
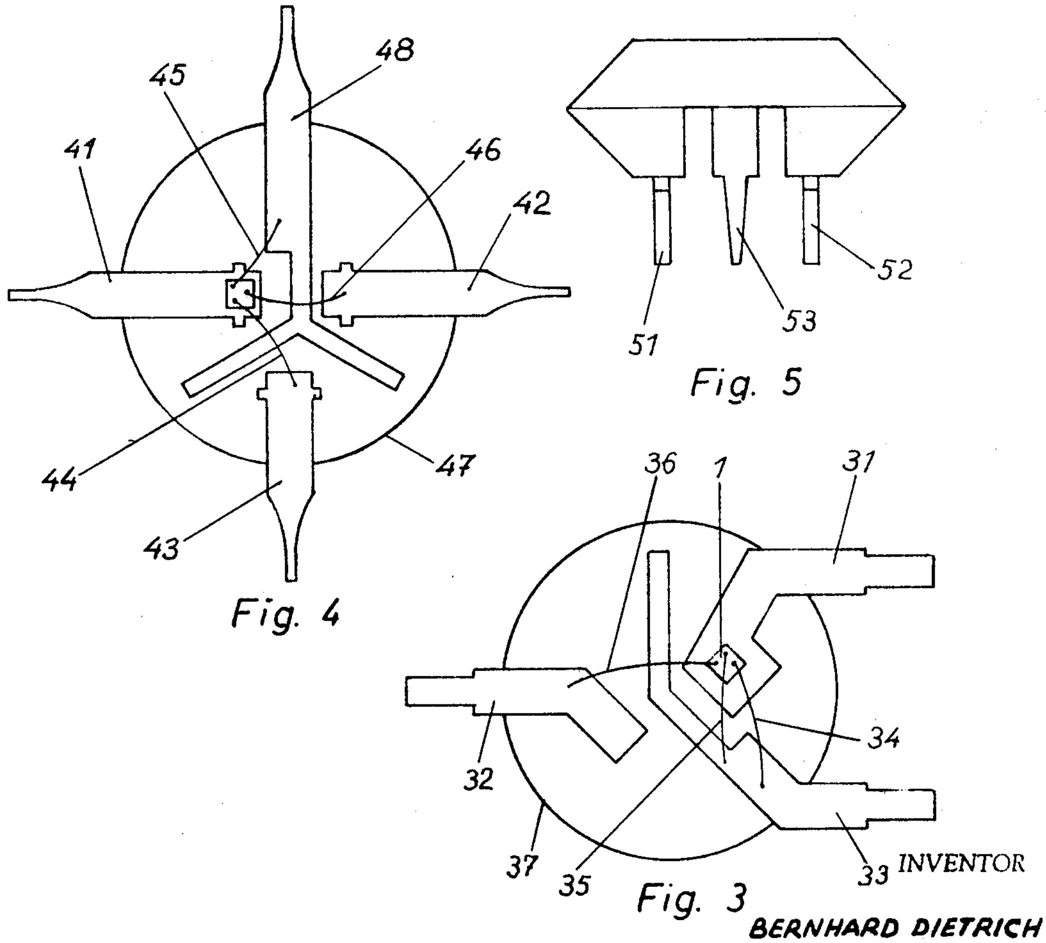

FIG. 3 shows a plastic encapsulated transistor device comprising lead-in electrodes bearing a great resemblance to that of FIG. 2. Reference numeral 31 indicates the collector lead-in electrode with the transistor 1 mounted thereto, 32 and 33 may be used optionally as the emitter or base lead-in electrode respectively, and the thin wires 34, 35 and 36 serve to connect the individual transistor electrodes to the respective lead-in electrodes. In this arrangement, by suitably designing the lead-in electrodes, in particular the lead-in electrodes 31 and 33, it has been achieved that there exists a still better shielding effect, in that the electrode 31 is surrounded semi-circularly or hemispherically by the electrode 33. The total arrangement is again enclosed and retained by the plastic encapsulation 37.

FIG. 4 shows a transistor with lead-in electrodes and plastic encapsulation, providing the possibility of applying the additional zones below the base and emitter lead-in, to a separate potential. To this end four lead-in electrodes are provided. Similar as in the types of embodiment according to FIGS. 2 and 3, the semi-conductor body 1 is again mounted to the collector lead-in electrodes 41, and the emitter and base contacts are connected to the lead-in electrodes 43 and 42 with the aid of the wires 44 and 46. The forth lead-in electrode 48 has a Y-shaped design at its inwardly pointing end, i.e. in such a way that each time one of the three branches of the Y will be lying shieldingly between each time two neighbouring lead-in electrodes. The contact surface 8 of the transistor zones reducing the capacitance, is connected to this additional lead-in electrode with the aid of the wire 45, and thus remains independent of both the emitter and the base potential. This electrode, for example, can be grounded in cases where it is not desirable for the base or emitter to be applied to mass. The total arrangement is again being held together by the plastic encapsulation 47.

For reasons of representation in FIGS. 2 to 4, the plastic encapsulation, for the sake of simplicity, is shown to be of spherical design. FIG. 5, by way of example, shows another possible shape in which the plastic encapsulation is of a cornered design. This configuration also permits an appropriate way of leading out the lead-in electrodes which, of course, unlike those in the simplified representation of FIGS. 2 to 4, may be bent off rectangularly.

While I have described above the principles of my invention in connection with specific apparatus, it is to be clearly understood that this description is made only by way of example and not as a limitation to the scope of my invention as set forth in the objects thereof and in the accompanying claims.

I claim:

1. A semiconductor device having an emitter, base and collector region formed within a body and emitter, base and collector electrodes respectively attached thereto, including a first additional region spaced from and below said emitter electrode, said first additional region being of opposite conductivity type to said collector region, and a second additional region spaced from and below said base electrode, said second additional region being of opposite conductivity type to said collector region, said additional regions forming a shielding zone comprising:

a contact on the surface of said body coupled to said first and second additional regions;

a collector lead-in electrode, said body being mounted on said collector lead-in electrode, said collector lead-in electrode being coupled to said collector electrode;

a base lead-in electrode coupled to said base electrode; and an emitter lead-in electrode coupled to said emitter electrode, one of said base and emitter lead-in electrodes being disposed between said collector lead-in electrode and the other of said base and emitter lead-in electrodes, said one lead-in electrode being electrically and mechanically coupled to said contact whereby said one lead-in electrode operates as a shield to improve the frequency response of the device.

2. A semiconductive device according to claim 1 wherein said electrodes comprise metal tapes and are embedded in a plastic encapsulation.

3. A semiconductive device according to claim 2 wherein said electrodes are strips of narrow width to reduce skin effect.

4. A semiconductive device according to claim 2 wherein the emitter electrode is disposed between the collector and base electrodes and emerges from two sides of said device.

5. A semiconductive device according to claim 2 wherein said shielding electrode is disposed in an arcuate manner and partially surrounds the collector electrode.

6. A semiconductive device according to claim 1 wherein said one electrode is in the form of a Y and the branches of the Y are arranged between the other lead-in electrodes.

References Cited

UNITED STATES PATENTS

| | | | |
|---|---|---|---|
| 2,903,630 | 9/1959 | Cohen et al. | 317—234 |
| 3,373,323 | 3/1968 | Wolfrum et al. | 317—235 |

OTHER REFERENCES

IBM Technical Disclosure Bulletin, Metal Lands on Insulating Substrates, by P. P. Castrucci et al., vol 8, No. 11, April 1966, p. 1679.

JOHN W. HUCKERT, Primary Examiner

R. F. POLISSACK, Assistant Examiner

U.S. Cl. X.R.

317—235